United States Patent
Thakur et al.

(10) Patent No.: US 6,346,455 B1
(45) Date of Patent: Feb. 12, 2002

(54) METHOD TO FORM A CORRUGATED STRUCTURE FOR ENHANCED CAPACITANCE

(75) Inventors: Randhir P. S. Thakur, San Jose, CA (US); Gordon Haller; Kirk D. Prall, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,946

(22) Filed: Aug. 31, 2000

(51) Int. Cl.[7] ................................................. H01L 21/20
(52) U.S. Cl. ........................ 438/398; 438/396; 438/735; 438/210
(58) Field of Search ................................. 438/398, 397, 438/735, 734, 396, 712, 210, 216

(56) References Cited

U.S. PATENT DOCUMENTS

| | | |
|---|---|---|
| 5,061,650 A | 10/1991 | Dennison et al. |
| 5,240,871 A | 8/1993 | Doan et al. |
| 5,300,801 A | 4/1994 | Blalock et al. |
| 5,466,627 A | 11/1995 | Lur et al. |
| 5,637,523 A | 6/1997 | Fazan et al. |
| 5,656,536 A | 8/1997 | Wu |
| 5,827,783 A | 10/1998 | Hsia et al. |
| 5,843,822 A | 12/1998 | Hsia et al. |
| 5,879,987 A | 3/1999 | Wang |
| 6,025,225 A | 2/2000 | Forbes et al. |
| 6,027,970 A | 2/2000 | Sharan et al. |
| 6,028,763 A | 2/2000 | Howard |
| 6,060,355 A | 5/2000 | Batra et al. |
| 6,074,926 A | 6/2000 | Cathey et al. |

*Primary Examiner*—Charles Bowers
*Assistant Examiner*—Yennhu B. Huynh
(74) *Attorney, Agent, or Firm*—TraskBritt

(57) ABSTRACT

A method of forming a corrugated capacitor on a semiconductor component. The method of forming the corrugated capacitor comprising a series of depositing alternating layers of doped silicon glass having different etch rates on a semiconductor component, covering the alternating layers with an etch resistant material, and etching the alternating layers thereby forming a capacitor structure having corrugated sides.

23 Claims, 3 Drawing Sheets

METHOD TO FORM A CORRUGATED STRUCTURE FOR ENHANCED CAPACITANCE

BACKGROUND OF THE INVENTION

1. Field of the Invention

The present invention relates to a method of fabrication of a corrugated structure having enhanced capacitance characteristics. More specifically, the present invention relates to a method of forming a corrugated capacitor cell comprising multiple layers of alternating material having differing etch rates thereby facilitating formation of rippled or corrugated capacitor walls for capacitor cells of semiconductor memory devices.

2. State of the Art

Dynamic random access memory, otherwise known as DRAM memory chip, die, or device, is a popular type of semiconductor memory device. A DRAM memory device is essentially multiple arrays formed by a series memory cells including a transistor, such as a metal-oxide-semiconductor field effect transistor (MOFSET) and an associated capacitor connected thereto fabricated on a substrate, such as a silicon substrate. The memory cells are combined with peripheral circuits to form the DRAM device. The state of the memory cell, either charged or uncharged, represents the state of a binary storage element, zero or one, (data) stored by the DRAM device in the memory cell. Multiple capacitors on a single silicon substrate or chip are therefore capable of storing large amounts of data. The greater the number of capacitors formed on a substrate or chip, the greater the memory capabilities of the DRAM memory device.

The popularity of the DRAM memory device is a direct result of the low cost involved in the production and manufacture of large quantities of DRAM memory devices. However, as the demand for smaller semiconductor substrates or chips with larger storage capacities evolved, the ability to produce DRAM memory devices meeting the new technological requirements becomes increasingly difficult. This is particularly evident as the size of the capacitor cell becomes increasingly smaller. As the capacitor cell size of a DRAM memory device decreases in size, the area of the memory substrate or chip allocated for the capacitor cell decreases in size making it more difficult for the capacitor cell to store the required electrical charge for the desired period in the capacitor cell during operation of the DRAM memory device. It is necessary to address the demands for greater capacitor cell storage for DRAM memory devices which are ever decreasing in size.

One solution which is capable of providing the necessary number of capacitors on a DRAM memory device is the formation of stacked type or trench type cell capacitors having larger surface areas. Typical manners which may be used for increasing capacitor cell surface area for stacked type capacitor cells are to use either fin-type capacitor cells, pillar-type capacitor cells, striated capacitor cell walls, rippled capacitor cell walls, or roughened-surface type capacitor cell wall. Such types of stacked capacitor cells are described in U.S. Pat. Nos. 5,061,650, 5,240,871, 5,300,801, 5,466,627, 5,519,238, 5623,243, 5,637,523, 5,656,536, 5,827,783, 5,843,822, and 5,879,987. It is further known to selectively texturize polysilicon electrodes with respect to neighboring dielectric surfaces in DRAM memory devices, such as described in U.S. Pat. No. 5,830,793.

However, construction of such capacitors having an increased surface area capacitor cell wall or electrode typically requires a restructuring of the process flow to facilitate manufacture of the capacitor cells. Further, the types of materials used for such capacitors having an increased surface area may require additional time for deposition or be difficult to deposit in a uniform manner using conventional deposition apparatus.

What is needed is a simple process for the construction of capacitor cells having increased wall area using existing equipment and processes so that existing process flow does not needed to be altered or slowed down for the deposition process.

BRIEF SUMMARY OF THE INVENTION

The present invention comprises a method of forming a rippled or corrugated capacitor cell wall having increased surface area used in capacitors in DRAM memory chips and semiconductor devices. More specifically, the invention relates to a method of forming a rippled or corrugated capacitor cell wall having increased surface area in a DRAM memory device using alternating layers of silicate glass which are subsequently etched to form the corrugated cell wall structure. The corrugated capacitor cell is constructed of alternating layers of germanium-borophospho silicate glass (Ge-BPSG) and boro phospho silicate glass (BPSG) or nitro silicate glass (NSG) and etched to form the rippled or corrugated cell wall. The formation of corrugated cell wall capacitors using the methods disclosed herein may be accomplished using current semiconductor device process technologies for materials having deposition rates comparable to those of the materials normally used for deposition in such process technologies.

Alternating layers of Ge-BPSG and BPSG, or NSG, are deposited on electrical contacts of a DRAM memory device or Metal Oxide Semiconductor Field Effect Transistor (MOSFET) using chemical vapor deposition (CVD) processes or plasma enhanced chemical vapor deposition processes (PECVD) using suitable apparatus operating at either atmospheric pressure levels or sub-atmospheric pressure levels. The layers are deposited in clusters such that individual capacitance cells are formed having trenches or spaces between each capacitance cell. Once the desired capacitance cell thickness is reached, the capacitance cells are capped with an etch-resistant layer. Introduction of either a wet or dry etchant into the trenches between the capacitance cells, however, etches the alternating layers at varying rates, thereby forming the rippled or corrugated wall of each capacitor cell. The form of the rippled or corrugated configuration of the capacitor cell wall is dependent upon the etch rates of the alternating layers, and specifically on the concentration of germanium (GE) in the GE-BPSG layers forming the capacitor cell.

BRIEF DESCRIPTION OF THE DRAWINGS

The advantages of this invention can be more readily ascertained from the following description of the invention when read in conjunction with the accompanying drawings in which.

DESCRIPTION OF THE ILLUSTRATED EMBODIMENTS

Figure 1:
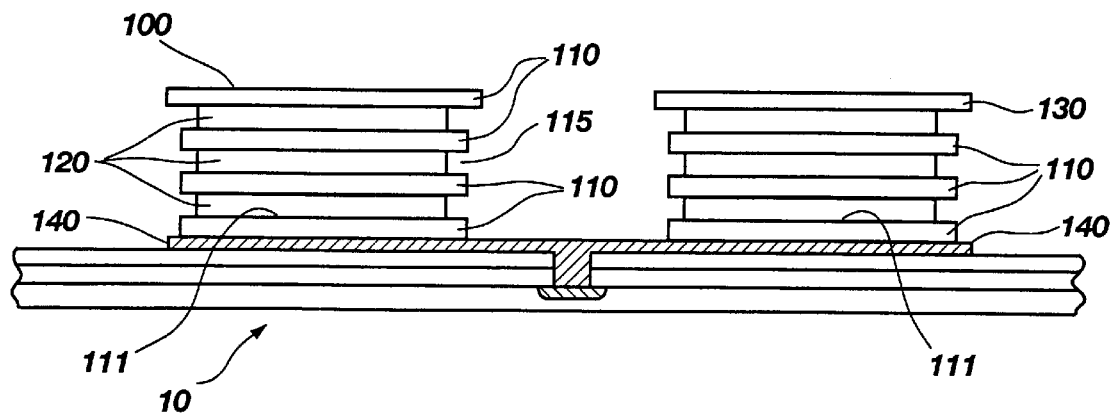
FIG. 1 illustrates a cross-sectional side view of a corrugated capacitor of the present invention.

Referring to drawing FIG. 1, the rippled or corrugated capacitor cell 100 of the present invention comprises a series of alternating first layers 110 and second layers 120 of doped silicon glass having rippled or corrugated sides, sandwiched between an electrical contact 140 located on a substrate 10 and an etch-resistant layer 130. The doped silicon glass of the first layer 110 and the second layer 120 preferably have different etch rates such that etching contributes to the corrugated or rippled nature of the side wall surface 115 of each corrugated capacitor cell 100. Illustrated in drawing FIG. 1 is a representative construction for a corrugated surface side wall capacitor 100. If desired, a layer of material 111, such as silicon dioxide, may be applied over the initial first layer 110 of doped silicon glass before the deposition of a second layer 120 of doped silicon glass thereover to serve as an etch stop during the formation of the capacitor cell 100 by an initial etching process of the alternating layers 110 of first layers 110 of doped silicon glass and second layers 120 of doped silicon glass.

Figure 2:
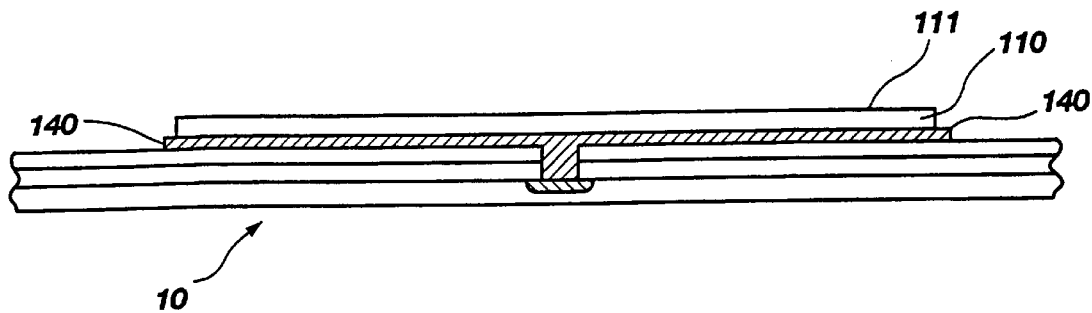
FIG. 2 illustrates a cross-sectional side view of the deposition of a first layer of doped silicate glass.

The corrugated capacitor cell 100 of drawing FIG. 1 is formed by a series of steps as illustrated in drawing FIGS. 2 through 5. Illustrates in drawing FIG. 2 is the deposition of a first layer 110 of doped silicon glass over an electrical contact 140 located on a MOSFET or similar semiconductor component on a silicon substrate 10. If such electrical contact 140 is not present on the semiconductor component to which the corrugated capacitor cell 100 is being formed, a suitable electrical contact 140 must first be deposited on the semiconductor component using methods as known in the art.

The first layer 110 of doped silicon glass is deposited over the electrical contact 140 by methods which provide a high deposition rate of formation. Such methods include chemical vapor deposition (CVD) or plasma-enhanced chemical vapor deposition (PECVD). The first layer 110 of doped silicon glass is typically BPSG or NSG.

Figure 3:
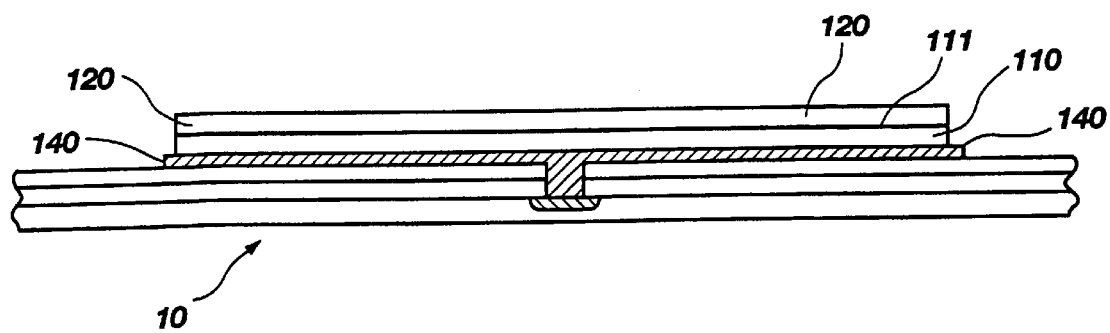
FIG. 3 illustrates a cross-sectional side view of the deposition of a first layer and second layer of doped silicate glass.
Figure 4:
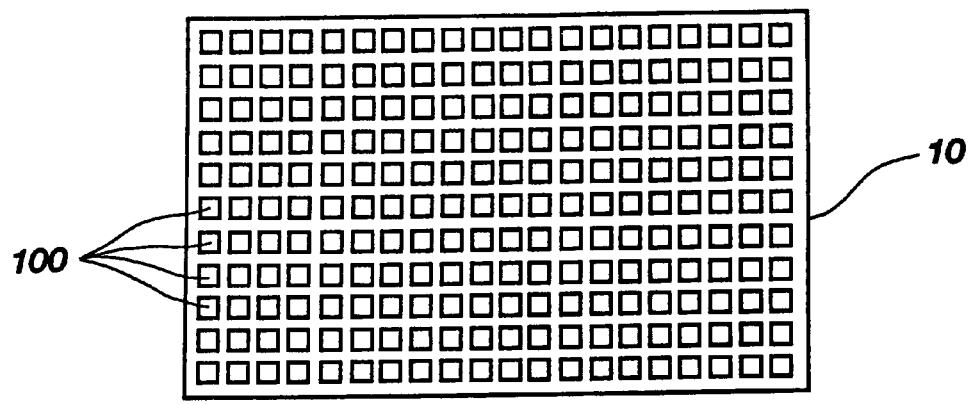
FIG. 4 illustrates a top plan view of a semiconductor component having an array of capacitance units formed from the alternating first layers and second layers of doped silicate glass.

Deposition of a second layer 120 of doped silicon glass, typically Ge-BPSG, over the first layer 110 is illustrated in drawing FIG. 3. As with the first layer 110, the second layer 120 is deposited using CVD and PECVD techniques. Alternate layering of first layers 110 and second layers 120 forms a capacitor having a desired thickness. Deposition of the alternating layers occurs in a cluster formation, in either atmospheric or subatmospheric conditions in a reaction chamber known in the art. Deposition of the first layer 110 and second layer 120 thereby form individual capacitance units which ultimately result in individual corrugated capacitor cells 100 of semiconductor die 10 as depicted in drawing FIG. 4.

Figure 5:
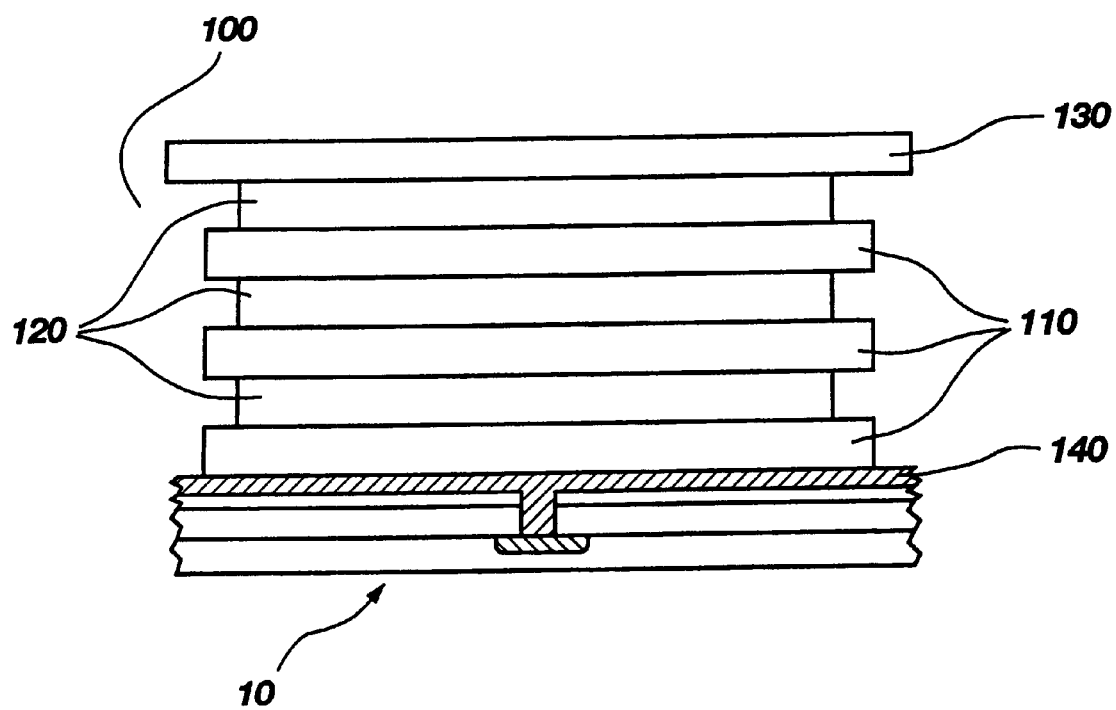
FIG. 5 illustrates a cross-sectional side view of the formation of an etch-resistant layer over the alternating first layers and second layers of doped silicate glass prior to etching.

As depicted in drawing FIG. 5, an etch-resistant layer 130 is deposited upon the uppermost surface of the last layer of doped silicon glass. The etch-resistant layer 130 inhibits degradation of the uppermost surface of the last layer of doped silicon glass during subsequent etching processes. Compositions of BPSG, NSG, and Ge-BPSG lend themselves to both dry and wet etching. Application of dry or wet etching to the structure illustrated in drawing FIG. 5 produces the corrugated capacitor cell 100 depicted in drawing FIG. 1. The rippled or corrugated nature of the sides of the corrugated capacitor cell 100 result from the difference in etch rates between the first layers 110 and the second layers 120 of the corrugated capacitor cell 100. The etch rate of Ge-BPSG is different than the etch rate of BPSG. This holds true even when the concentrations of boron (B) and phosphorus (P) are the same in Ge-BPSG and BPSG. It has been found that by altering the concentration of germanium (Ge) in the GE-BPSG, the etch rate of the Ge-BPSG may be modulated, thereby providing the ability to alter the corrugated nature of the sides of the corrugated capacitor 100 according to the concentration of germanium (Ge) in the Ge-BPSG. The ability to modulate the etch rate of the Ge-BPSG layers of the corrugated capacitor cell 100 provides a convenient method by which corrugated capacitors 100 may be formed more readily over the methods of the prior art.

Formation of corrugated capacitor cells 100 on semiconductor structures, such as DRAM memory devices, by the described method is advantageous because the method conforms with current processing techniques thereby improving the throughput of memory chips due to higher deposition rates and faster etch rates of Ge-BPSG, BPSG, and NSG with the ability to use conventional process equipment.

Figure 1A:
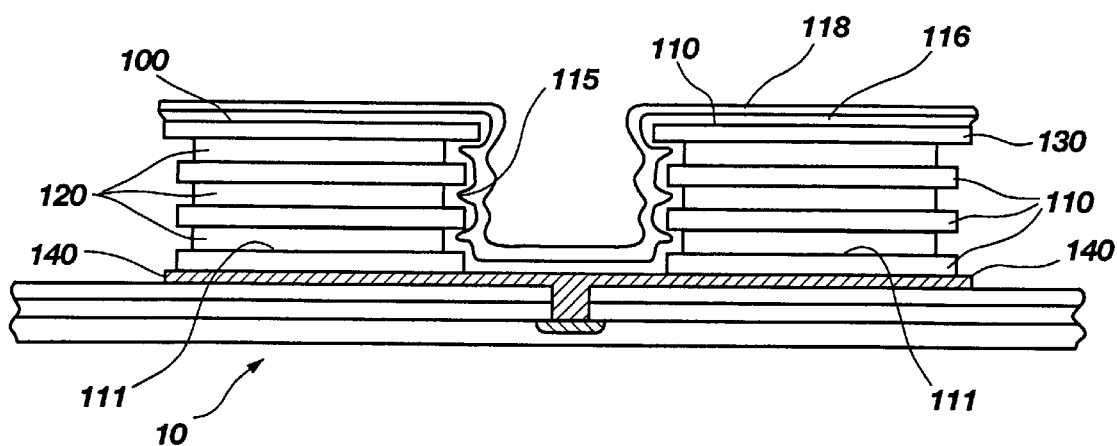
FIG. 1A illustrates a cross-sectional side view of a corrugated capacitor of the present invention having a dielectric layer and a top electrode layer.

Referring to drawing FIG. 1A, after the corrugated capacitor cells 100 are formed having corrugated or rippled sidewall surface 115, a dielectric layer 116 is deposited over the sidewall surface 115 and the upper layer 130. The dielectric material may be $Si_3N_4$, $Ta_2O_5$, BST, etc. After the dielectric layer 116 is deposited, an anneal process is performed on the substrate 10 used to form the semiconductor die for the redistribution of dopants used therein. Subsequently, a top electrode layer 118 is deposited over the dielectric layer 116 to form the top electrode for each capacitor cell 100. The material used for the layer 118 forming the top electrode of the capacitor cell 100 may be Si—Ge.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A method of forming a corrugated capacitor structure for enhanced capacitance on a substrate, comprising: providing at least one electrical contact on said substrate; forming a first layer of doped silicate glass having a first composition over at least a
   portion of said electrical contact; forming a second layer of doped silicate glass having a second composition different
   than the first composition of said first layer of doped silicate glass over at least a
   portion of said first layer of doped silicate glass; forming an etch-resistant layer over at least a portion of said second layer of doped
   silicate glass; and etching said first layer of doped silicate glass and said second layer of doped silicate
   glass to form a contact opening having a side wall in said first layer of doped
   silicate glass and said second layer of doped silicate glass, the side wall of the
   contact opening having a corrugated surface.

2. The method of claim 1, wherein said at least one electrical contact includes an electrical contact of a memory device.

3. The method of claim 1, wherein said first layer of doped silicate glass has a different rate of etching than said second layer of doped silicate glass.

4. The method of claim 1, wherein said first layer of doped silicate glass includes boro-phospho silicate glass and said second layer of doped silicate glass includes germanium boro-phospho silicate glass.

5. The method of claim 1, wherein said first layer of doped silicate glass includes boro-phospho silicate glass and said second layer of doped silicate glass includes nitro silicate glass.

6. The method of claim 1, wherein said etching of said first layer of doped silicate glass and said second layer of doped silicate glass to form said side wall of the contact opening having a corrugated surface occurs at subatmospheric pressure level.

7. The method of claim 1, wherein said etching of said first layer of doped silicate glass and said second layer of doped silicate glass to form said side wall of the contact opening having a corrugated surface occurs at an atmospheric pressure level.

8. The method of claim 1, wherein said etching includes a dry etchant.

9. The method of claim 1, wherein said etching includes a wet etchant.

10. The method of claim 1, wherein said first layer of doped silicate glass and said second layer of doped silicate glass are formed by a chemical vapor deposition process.

11. The method of claim 1, wherein said first layer of doped silicate glass and said second layer of doped silicate glass are formed by a plasma enhanced chemical vapor deposition.

12. The method of claim 1, further comprising:

depositing a dielectric layer; and deposition a conductive layer over the dielectric layer.

13. The method of claim 12, wherein the dielectric layer comprises one of $Si_3N_4$, $Ta_2O_5$, and BST.

14. The method of claim 12, wherein the conductive layer comprises Si—Ge.

15. A method of forming a corrugated capacitor structure for enhanced capacitance, comprising:

providing a substrate having at least one electrical contact area;

depositing a plurality of layers of insulating material over at least a portion of said electrical contact area of said substrate, said plurality of layers of insulating material including a plurality of first layers of boro-phospho silicate glass and a plurality of second layers of germanium boro-phospho silicate glass, each first layer of said plurality of first layers of boro-phospho silicate glass having a portion thereof contacting a portion of a layer of said plurality of second layers of germanium boro-phospho silicate glass, said first plurality of layers of boro-phospho silicate glass having a first etch rate and said plurality of second layers of germanium boro-phospho silicate glass having a second etch rate different than the first etch rate of said first plurality of layers of boro-phospho silicate glass;

depositing an etch resistant layer over said plurality of first layers of boro-phospho silicate glass and said plurality of second layers of germanium boro-phospho silicate glass; and etching said plurality of first layers of boro-phospho silicate glass and said plurality of second layers of germanium boro-phospho silicate glass to form a contact opening having a side wall in said plurality of first layers of boro-phospho silicate glass and said plurality of second layers of germanium boro-phospho silicate glass, the side wall of the contact opening having a corrugated surface.

16. The method of claim 15, wherein said at least one electrical contact includes at least one electrical contact of a plurality of electrical contacts of a memory device.

17. The method of claim 15, wherein depositing said plurality of first layers of boro-phospho silicate glass and said plurality of second layers of germanium boro-phospho silicate glass occurs at a subatmospheric pressure level.

18. The method of claim 15, wherein said depositing said plurality of first layers of boro-phospho silicate glass and said plurality of second layers of germanium boro-phospho silicate glass occurs at an atmospheric pressure level.

19. The method of claim 15, wherein said etching includes a dry etchant.

20. The method of claim 15, wherein said etching includes a wet etchant.

21. The method of claim 15, wherein said plurality of first layers of boro-phospho silicate glass and said plurality of second layers of germanium boro-phospho silicate includes deposition by chemical vapor deposition.

22. The method of claim 15, wherein said plurality of first layers of boro-phospho silicate glass and said plurality of second layers of germanium boro-phospho silicate includes deposition by plasma enhanced chemical vapor deposition.

23. A method of forming a corrugated capacitor structure comprising:

providing a wafer having an array of conductive contacts located thereon;

forming alternating layers of boro-phoso silicate glass and germanium boro-phospho silicate glass having a stacked configuration of overlaying layers by chemical vapor deposition upon said array of conductive contacts of said wafer;

forming an etch-resistant layer over at least a portion of the upper layer of said alternating layers of boro-phoso silicate glass and germanium boro-phospho silicate glass; and exposing said at least one conductive contact having alternating layers of boro-phoso silicate glass and germanium boro-phospho silicate glass formed thereon to an etchant, for etching said alternating layers of boro-phoso silicate glass and germanium boro-phospho silicate glass to form a capacitor cell having corrugated sidewall.

* * * * *

UNITED STATES PATENT AND TRADEMARK OFFICE
CERTIFICATE OF CORRECTION

PATENT NO. : 6,346,455 B1
DATED : February 12, 2002
INVENTOR(S) : Randhir P.S. Thakur, Gordon Haller and Kirk D. Prall It is certified that error appears in the above-identified patent and that said Letters Patent is hereby corrected as shown below:

<u>Title page,</u>
Item [57], ABSTRACT,
Line 3, change "comprising" to -- comprises --
Line 6, change "etch resistant" to -- etch-resistant --

<u>Column 3,</u>
Line 23, after "capacitor" and before "100" insert -- cell --
Line 27, after "the" and before "capacitor" insert -- corrugated --
Line 28, before "alternating" delete "the" and delete "110"
Lines 44-46, change "chemical vapor deposition (CVD) or plasma enhanced chemical vapor deposition (PECVD)" to -- CVD or PECVD --

<u>Column 4,</u>
Line 13, after "capacitor" and before "100" insert -- cell --
Line 52, after "said" and before "electrical" insert -- at least one --

<u>Column 5,</u>
Lines 17 and 23, delete "said side wall of the"
Lines 18 and 24, after "opening" and before "having" insert -- having a side wall --
Lines 25 and 27, after "includes" insert -- use of --
Line 34, change "plasma enhanced" to -- plasma-enhanced --
Line 38, change "deposition" to -- depositing --
Line 49, after "said" and before "electrical" insert -- at least one --

<u>Column 6,</u>
Line 3, change "etch resistant" to -- etch-resistant --
Line 16, after "contact" and before "includes" insert -- area --
Line 18, before "depositing" insert -- said --
Lines 26 and 28, after "includes" insert -- use of --
Lines 32 and 36, after "silicate" and before "includes" insert -- glass -- and change "includes" to -- include --
Line 37, change "plasma enhanced" to -- plasma-enhanced --
Line 38, insert a comma after "structure"
Lines 42 and 53, change "-phoso" to -- phospho --

UNITED STATES PATENT AND TRADEMARK OFFICE
CERTIFICATE OF CORRECTION

PATENT NO. : 6,346,455 B1
DATED : February 12, 2002
INVENTOR(S) : Randhir P.S. Thakur, Gordon Haller and Kirk D. Prall It is certified that error appears in the above-identified patent and that said Letters Patent is hereby corrected as shown below:

Column 6, cont'd,
Line 49, before "upper" change "the" to -- an -- and change "-phoso" to -- -phospho --
Line 52, before "at least" delete "said"
Line 52, after "contact" and before "having" insert -- of said array of conductive contacts --
Line 55, change "etchant," to -- etchant --
Line 56, change "phoso" to -- phospho --
Line 57, after "having" and before "corrugated" insert -- a --
Line 58, change "sidewall" to -- side wall --

Signed and Sealed this

Fifteenth Day of July, 2003

JAMES E. ROGAN
*Director of the United States Patent and Trademark Office*